(12) United States Patent
Viala (10) Patent No.: US 10,205,408 B2
(45) Date of Patent: Feb. 12, 2019

(54) CONVERTER FOR CONVERTING ENERGY TO BE RECOVERED AND ELECTRICITY GENERATOR

(71) Applicant: COMMISSARIAT A L'ENERGIE ATOMIQUE ET AUX ENERGIES ALTERNATIVES, Paris (FR)

(72) Inventor: Bernard Viala, Sassenage (FR)

(73) Assignee: COMMISSARIAT À L'ÉNERGIE ATOMIQUE ET AUX ÉNERGIES ALTERNATIVES, Paris (FR)

(*) Notice: Subject to any disclaimer, the term of this patent is extended or adjusted under 35 U.S.C. 154(b) by 285 days.

(21) Appl. No.: 15/031,948

(22) PCT Filed: Oct. 23, 2014

(86) PCT No.: PCT/FR2014/052703
§ 371 (c)(1),
(2) Date: Apr. 25, 2016

(87) PCT Pub. No.: WO2015/059418
PCT Pub. Date: Apr. 30, 2015

(65) Prior Publication Data
US 2016/0268930 A1 Sep. 15, 2016

(30) Foreign Application Priority Data
Oct. 25, 2013 (FR) .................... 13 60433

(51) Int. Cl.
*H02N 2/18* (2006.01)
*H01L 41/113* (2006.01)
*H01L 41/00* (2013.01)

(52) U.S. Cl.
CPC ............... *H02N 2/18* (2013.01); *H01L 41/00* (2013.01); *H01L 41/1138* (2013.01)

(58) Field of Classification Search
CPC ............... H01L 41/113; H01L 41/1132; H01L 41/1134; H01L 41/1136; H01L 41/1138; H02N 2/18
USPC ........................................ 310/339
See application file for complete search history.

(56) References Cited

U.S. PATENT DOCUMENTS 7,696,673 B1* 4/2010 Yavid ................... F42C 11/02
310/329
2008/0129147 A1 6/2008 Thiesen et al.
(Continued)

FOREIGN PATENT DOCUMENTS

| EP | 2 501 031 A1 | 9/2012 |
| WO | 2006/046937 A1 | 5/2006 |
| WO | 2013/042505 A1 | 3/2013 |

OTHER PUBLICATIONS

P. Li, et al., "Effect of adjustable bias voltage on magnetoelectric properties of piezoelectric/magnetostrictive laminate transducer," 2012 IEEE International Ultrasonics Symposium Proceedings, pp. 2510-2513.

(Continued)

*Primary Examiner* — Derek Rosenau
(74) *Attorney, Agent, or Firm* — Oblon, McClelland, Maier & Neustadt, L.L.P.

(57) ABSTRACT

A converter including a transducer layer which moves anchoring points to deform a piezoelectric diaphragm by bending. The converter includes a rigid arm between each anchoring point and a point for securing to the piezoelectric diaphragm to which it is attached, the rigid arm being tensioned between the anchoring point and the securing point and configured to transform movement of the anchoring points into a movement that deforms the piezoelectric diaphragm between bent and less bent positions. The securing point is located at the mid-point when the ends of the piezoelectric diaphragm are secured, with no degree of (Continued)

freedom, in a frame, and the securing point is located at one end of the piezoelectric diaphragm when the mid-point is secured, with no degree of freedom, in the frame.

15 Claims, 4 Drawing Sheets

(56) References Cited

U.S. PATENT DOCUMENTS

| | | | |
|---|---|---|---|
| 2009/0315335 A1 | 12/2009 | Ujihara et al. | |
| 2010/0207491 A1* | 8/2010 | Gammaitoni | H01L 41/1136 310/339 |
| 2012/0119620 A1 | 5/2012 | Xu et al. | |
| 2012/0248937 A1 | 10/2012 | Hayamizu | |
| 2014/0340376 A1 | 11/2014 | Itagaki et al. | |

OTHER PUBLICATIONS

M. Guo, et al., "Annular Bilayer Magnetoelectric Composites: Theoretical Analysis," IEEE Transactions on Ultrasonics, Ferroelectrics, and Frequency Control, vol. 57, No. 2, Feb. 2010, pp. 480-489.

P. Li, et al., "High Efficiency Passive Magnetoelectric Transducer Consisting of PZT and Fe—Ni Fork Substrate with High Q Value," IEEE Sensors 2010 Conference, pp. 178-181.

D. Zakharov, et al., "Thermal energy conversion by coupled shape memory and piezoelectric effects," Journal of Micromechanics and Microengineering, 2012, 8 pages.

G. A. Lebedev, et al., "Thermal Energy Harvesting Using Shape Memory/Piezoelectric Composites," IEEE, Transducers '11, 2011, pp. 669-670.

International Search Report dated Mar. 13, 2015 in PCT/FR2014/052703 Filed Oct. 23, 2014.

* cited by examiner

CONVERTER FOR CONVERTING ENERGY TO BE RECOVERED AND ELECTRICITY GENERATOR

The invention relates to a converter of a variation of energy to be harvested into a potential difference between two connection terminals, the variation of energy to be harvested being a variation of magnetic field or of temperature.

The invention relates also to an electricity generator incorporating this converter.

Known electricity converters comprise:

a piezoelectric membrane having parallel inner and outer faces and at least two ends diametrically opposed relative to a plane at right angles to its inner and outer faces, and passing through the center of gravity of the piezoelectric membrane, first and second electrodes of electrically conductive material extending essentially along at least one face of the piezoelectric membrane to reveal an excess of electrical charges on one of these electrodes in response to the deformation of the piezoelectric membrane, a transducer layer extending between anchoring points, this transducer layer being suitable for transforming the variation of energy to be harvested into a mechanical displacement of the anchoring points relative to one another between a distant position, in which the anchoring points are distant from one another, and a close position in which the anchoring points are closer to one another, at least one of these anchoring points being attached to one end of the piezoelectric membrane to deform this piezoelectric membrane by bending reversibly between a bent position and a less bent position when this anchoring point is displaced, the amplitude of the maximum travel between its bent and less bent positions being greater than the thickness of the piezoelectric membrane.

Such a converter, in which the membrane works by bending is for example described with reference to FIG. 3 in the following article A1: Zakharov, G. Lebedev, O. Cugat, J. Delamare, B. Viala, T. Lafont, L. Gimeno and A. Shelyakov, "*Thermal energy conversion by coupled shape memory and piezoelectric effects*", PowerMEMS'11, Seoul, Korea, JMM 2012.

Hereinbelow, it is considered that a piezoelectric membrane works by bending if the amplitude of the maximum travel between its bent and less bent positions is greater than the thickness of the piezoelectric membrane and, preferably, greater than 10, 100 or 1000 times the thickness of the piezoelectric membrane.

In the article A1, the piezoelectric membrane takes the form of a beam of which one of the ends is anchored with no degree of freedom in a frame while the diametrically opposite end is displaced by a wire made of material with shape memory.

In such an embodiment, the fact that the piezoelectric membrane works by bending makes it possible to increase the efficiency of the converter compared to an embodiment in which it works without bending. Such an embodiment without bending deformation is described with reference to FIG. 1 of the article A1.

The efficiency is defined here as being the quantity of electrical energy produced in response to a same variation of the energy to be harvested.

From the prior art, there are also known:
US2009/315335A1,
PING et al: "Effect of adjustable bias voltage on magnetoelectric properties of piezoelectric/magnetostrictive laminate transducer", Ultrasonic symposium 2012 IEEE, 7 Oct. 2012, pages 2510-2513,
MINGSEN et al: "Annular bilayer magnetoelectric composites: theoretical analysis", IEEE Transactions on ultrasonics, Ferroelectric and frequency control", Vol. 57, N° 2, 1 Feb. 2010, pages 480-489,
PING et al: "High efficiency passive magnetoelectric transducer consisting of PZT and Fe—Ni fork substrate with high Q value", Sensors 2010 IEEE, 2010 Nov. 1, pages 178-181,
WO2013/042505A1, The invention aims to further increase the efficiency of such a converter.

The subject thereof is therefore a converter according to claim 1.

By fixing the anchoring point at diametrically opposite ends of the piezoelectric membrane, it becomes possible to simultaneously exert forces, with opposite signs of the same amplitude, on these ends of the piezoelectric membrane. In these conditions, the mechanical stresses which are exerted on the outer and inner faces of this membrane are much more uniformly distributed. This homogenization of the distribution of the mechanical stresses makes it possible to generate more electrical charges for a same variation of the energy to be harvested than if one of the ends of the membrane were anchored with no degree of freedom in a frame. It therefore makes it possible to improve the efficiency of the converter.

Furthermore, by fixing the anchoring points to the ends of the piezoelectric membrane it becomes possible to obtain a uniform distribution of the mechanical stresses on the outer and inner faces of the membrane.

By fixing the ends of the piezoelectric membrane with no degree of freedom in a frame and fixing the anchoring points at the mid-point of this membrane, it becomes possible to displace this mid-point at right angles to the plane of the membrane. In these conditions, a uniform distribution of the mechanical stresses on the outer and inner faces of the membrane is also obtained. As previously, this standardization of the distribution of the mechanical stresses in the piezoelectric membrane makes it possible to generate more electrical charges in response to a same variation of the energy to be harvested, which makes it possible to increase the efficiency of the converter.

Finally, the use of a frame and of arms to attach each anchoring point to the fixing point makes it possible to obtain a greater deformation of the membrane than if the membrane were directly fixed onto the transducer layer. Furthermore, that makes it possible to have a membrane that is flat in the less bent position and therefore avoid having to pre-stress this membrane.

The embodiments of this converter can comprise one or more of the features of the dependent converter claims.

These embodiments of the converter further offer the following advantages:

using a set of blocks of material with shape memory whose deformation is anisotropic makes it possible to increase the amplitude of the displacements of the anchoring points for a same variation of temperature, and therefore makes it possible to further increase the efficiency of the converter relative to the case in which the deformation of the transducer layer would be isotropic;

using more than three blocks makes it possible to simultaneously deform the piezoelectric membrane by bending about at least two different axes, which makes it possible to increase the efficiency of the converter.

Another subject of the invention is an electricity generator according to the independent generator claim.

By simultaneously using a number of first blocks and a number of first sources of energy to be harvested arranged relative to one another so that, in the first position, the mechanical stresses exerted by each of the first blocks are simultaneously maximum, it is possible to increase the quantity of electrical charges generated by a displacement of the converter relative to the case where the converter comprises only a single block of magnetostrictive material or material with shape memory. The second position makes it possible to alternate between the first position in which the mechanical stresses are maximum and the second position in which the mechanical stresses are lesser or of opposite sign. By virtue of this, the potential difference produced by the converter varies as the set of sources of energy to be harvested alternates between the first and second positions. It is therefore possible to produce electrical energy on each displacement of the set relative to the converter from sources of energy to be harvested which do not necessarily vary over time. In the absence of such variations of the stress, the production of electrical energy would be impossible.

The embodiments of this generator can comprise one or more of the features of the dependent generator claims.

These embodiments of the generator also offer the following advantages:

the presence of the second sources of magnetic field or of second blocks of magnetostrictive material inserted between the first blocks, makes it possible to increase the amplitude of the deformations between the first and second positions which increases the efficiency of the generator, the use of local sources of heat that can be displaced between the first and second positions makes it possible to generate electrical energy even if the temperature of the sources of heat does not vary.

The invention will be better understood on reading the following description, given purely as a nonlimiting example and with reference to the drawings in which:

FIG. 10 is a schematic illustration, in plan view, of an arrangement of a set of permanent magnets likely to be used in place of the arrangement of permanent magnets of FIG. 2 in the particular case of the transducer layer of FIG. 9;

In these figures, the same references are used to denote the same elements.

Hereinafter in this description, the features or functions that are well known to those skilled in the art are not described in detail.

Figure 15:
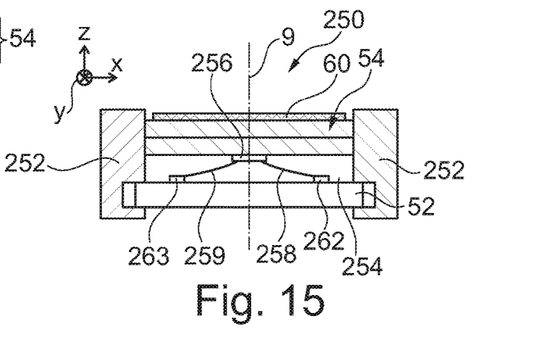
Figure 16:
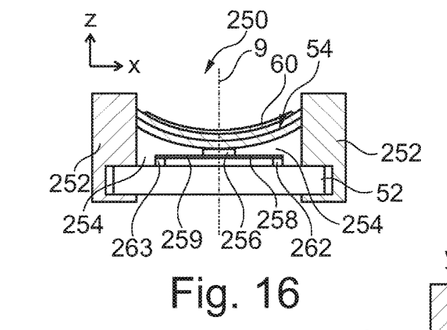
Figure 17:
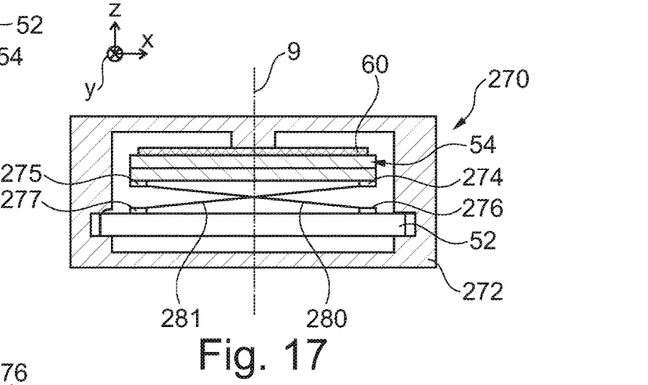

The embodiments described with reference to FIGS. 1 to 14 and 18 to 19 illustrate embodiments of a converter without any arms and which are therefore not protected by the current claim 1. Only FIGS. 15 to 17 represent converters equipped with arms. However, these features described with reference to these FIGS. 1 to 14 and 18 to 19 come together again in the embodiments of FIGS. 15 to 17 or can be combined with the features of the embodiments of FIGS. 15 to 17. Thus, the embodiments of FIGS. 1 to 14 and 18 to 19 are useful to the description of the converters of FIGS. 15 to 17.

Figure 1:
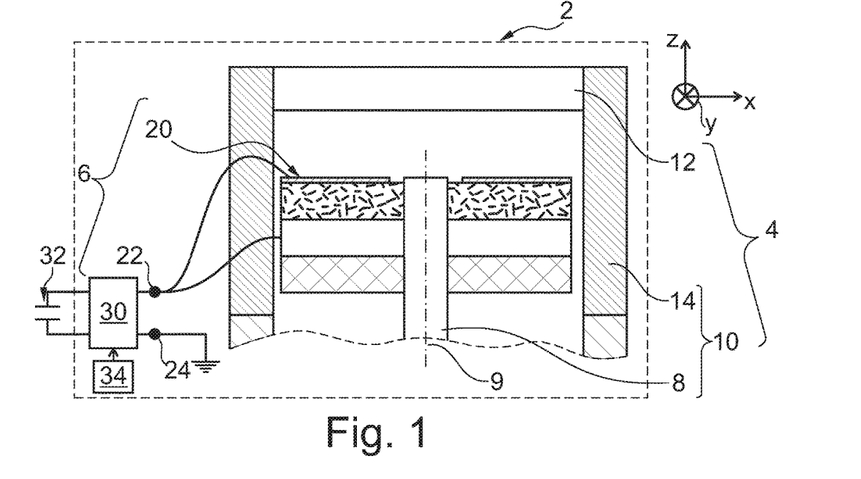
FIG. 1 is a schematic illustration, partially in vertical cross section, of an electricity generator.

FIG. 1 represents a generator 2 of electricity. This generator 2 comprises:
  a source 4 of energy to be harvested, and
  a harvester 6 of energy specifically for transforming the energy to be harvested into electrical energy.

In this first embodiment, the energy to be harvested is a rotation of a magnetic field. For example, the magnetic field revolves around a vertical axis Z of an orthogonal reference frame X, Y, Z. Hereinbelow, each of the figures is oriented relative to this reference frame X, Y, Z.

In this embodiment, the source 4 comprises:
  a shaft 8 driven in rotation about a vertical axis 9 and onto which is fixed, with no degree of freedom, a converter 20 of the energy harvester 6, and
  a set 12 of uni-axial sources of magnetic field fixed with no degree of freedom onto an immobile frame 14 in proximity to the converter 20.

The shaft 8 is the shaft of an apparatus 10. The apparatus 10 is, for example, a liquid or gas meter and the shaft 8 is the shaft of this apparatus driven in rotation in the metering of the liquid or gas consumed. To simplify, only a part of the apparatus 10 is represented.

The energy harvester 6 comprises:
  the converter 20 which converts the revolving magnetic field into a corresponding excess of electrical charges on a connection terminal 22 or 24 relative to the other of these terminals 22, 24.
  a circuit 30 for collecting the excess of electrical charges on the terminal 22 or 24 and for transferring these collected electrical charges to an electrical element 32, and
  a circuit 34 for controlling the collection circuit 30.

The element 32 is an electricity storage or consumption or transmission element. It comprises one or more electrical components. For example, the element 32 is capacitor which stores the harvested electrical energy.

The collection circuit 30 and the control circuit 34 are, for example, identical to those described in the application WO 2007/063194 and, preferably, identical to one of those described in the application filed under the number FR 1260047, on 22 Oct. 2012 by the applicant "Commissariat à l'énergie atomique et aux énergies alternatives". Consequently, these circuits 30 and 34 are not described here in more detail.

Figure 2:
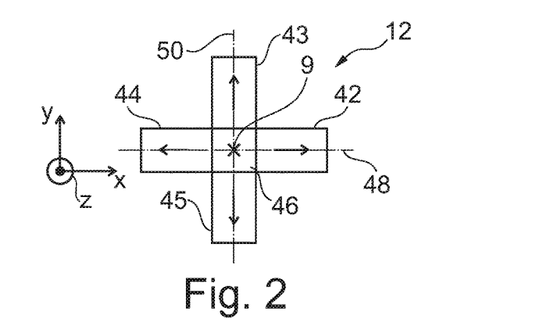
FIG. 2 is an illustration, in plan view, of a set of permanent magnets used in the generator of FIG. 1, FIGS. 3 and 4 are schematic illustrations, in vertical cross section, of a converter used in the generator of FIG. 1 in, respectively, a less bent position and a bent position.

FIG. 2 represents the set 12 in more detail. Here, each source of magnetic field of the set 12 corresponds to a uni-axial permanent magnet. "Uni-axial" denotes the fact that each source has just one magnetic moment. In FIG. 2 and subsequent figures, the magnetic moment of each permanent magnet is represented by an arrow. However, the sign in which this magnetic moment is directed is not necessarily important because a magnetostrictive material is not sensitive to the sign of the field lines. The permanent magnets of the set 12 are fixed to one another with no degree of freedom such that the set 12 simultaneously and permanently has a number of magnetic moments whose orthogonal projections in a horizontal plane are angularly offset relative to one another about the axis 9.

Here, the set 12 comprises four permanent magnets 42 to 45. In FIG. 2, the magnetic moments of the magnets 42 and 44 are parallel to the direction X and the magnetic moments of the magnets 43 and 45 are parallel to the direction Y. More specifically, in the position represented, the magnetic moments of the magnets 42 and 44 are aligned above a horizontal axis 48 parallel to the direction X and intersecting the axis 9. At the same time, the magnetic moments of the magnets 43 and 45 are aligned above a horizontal axis 50 parallel to the direction Y and intersecting the axis 9. The magnets 42 and 44 are symmetrical to one another relative to a vertical plane passing through the axis 50. Likewise, the magnets 43 and 45 are symmetrical to one another relative to a vertical plane passing through the axis 48. Here, the magnets 42 to 45 are arranged at each end of a cross. Furthermore, in this embodiment, the set 12 comprises a central magnet 46 situated on the axis 9 and attached to the north poles of the magnets 42 to 45. The magnetic moment of this magnet 46 is vertical and situated on the axis 9. It reinforces the field lines from the magnets 42 to 45 to the converter 20.

The converter 20 will now be described in more detail with reference to FIGS. 3 to 6. This converter 20 is capable of transforming very slow variations of the energy to be harvested into electricity. "Slow variation" describes variations whose fundamental frequency is less than 1 Hz or 10 Hz. To this end, the converter 20 converts a variation of the amplitude of the magnetic field that is variable in a given direction into a generation of an excess of charges on the terminal 22 relative to the terminal 24. This conversion is done almost instantaneously such that the voltage between the terminals 22 and 24 varies at the same time and as the amplitude of the variable magnetic field varies in a given direction.

Figure 3:
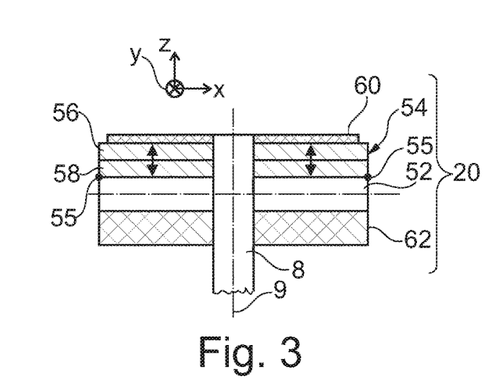
Figure 4:
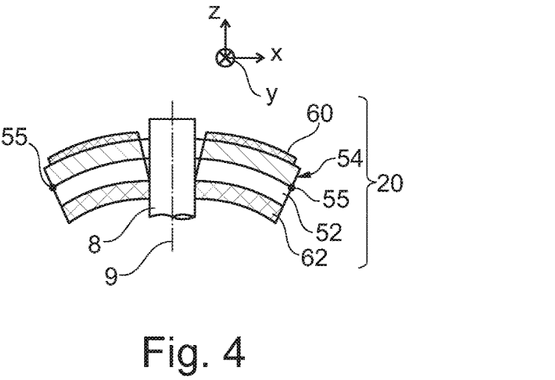

In this embodiment, the converter 20 comprises a transducer layer 52 which displaces a piezoelectric membrane 54 between a bent position, represented in FIG. 4, and a less bent position represented in FIG. 3. In this embodiment, in the absence of external magnetic field, the membrane 54 is in its less bent position. This position is therefore also hereinafter called "rest position".

In the rest position, the membrane 54 extends horizontally over all of the face of the top of the layer 52. In this embodiment, it has an inner face directly fixed, with no degree of freedom, onto this top face of the layer 52 via anchoring points. Here, the bottom face is glued onto most and, typically, more than 90% or 98% of the top face of the layer 52. In these conditions, the number of anchoring points is considered to be infinite. To simplify FIG. 3, only anchoring points 55 situated on the outer periphery of the membrane 54 and of the layer 52 have been represented. These anchoring points 55 are therefore attached to respective ends of the membrane 54. These ends are symmetrical to one another relative to the axis 9. The axis 9 passes through the center of gravity of the membrane 54 and of the layer 52. Here, the anchoring points 55 are directly attached to these ends, for example, by direct gluing of the layer 52 onto the membrane 54 or via a layer of glue. In the rest position, these anchoring points 55 are more distant from one another than in the bent position. Consequently, it can be stated that the points 55 are in distant and close positions when the membrane 54 is in its respective rest and bent positions.

Figure 5:
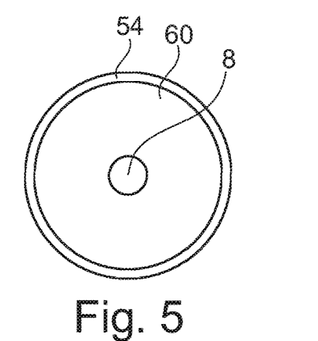
FIG. 5 is a schematic illustration, in plan view, of the converter of FIG. 3.

In the rest position, the membrane 54 extends uniformly in each horizontal direction. For example, in this embodiment, the membrane 54 has the form of a horizontal disk passed through at its center by the shaft 8 (FIG. 5).

The membrane 54 also comprises a horizontal outer face situated on the side opposite the inner face.

In its operation, the membrane 54 generates an excess of electrical charges on its outer and inner faces when it is in its bent position. This mode of operation is known by the term mode $d_{31}$. In this mode of operation, the capacity of the membrane 54 is great, which improves and facilitates the operation of the converter 20. Typically, this mode of operation of the membrane 54 is obtained with a piezoelectric material polarized parallel to its thickness.

More specifically, here, the membrane 54 is formed by the superpositioning of two layers 56, 58 one on top of the other in the vertical direction. Typically, these layers 56 and 58 are produced in the same piezoelectric material except that they are polarized vertically with reverse signs to one another. The directions of polarization of the layers 56 and 58 are represented by bold arrows within these layers in FIG. 3. Here, these layers 56, 58 are glued directly to one another. In these conditions, in the bent position, the layers 56 and 58 cause charges to appear that are of the same sign, for example positive, on the outer and inner faces of the membrane 54.

Here, the piezoelectric material has a coupling coefficient k greater than 5% or 10%. This coupling coefficient is defined in the ANSI/IEEE standard 176-1987 "ANSI/IEEE Standard on Piezoelectricity" or in the standards of the EN 50-324 family. More specifically, here, the piezoelectric material used has a piezoelectric coefficient $g_{31}$ greater than $5 \times 10^{-3}$ Vm/N and, preferably, greater than $10 \times 10^{-3}$ Vm/N or $100 \times 10^{-3}$ Vm/N or $200 \times 10^{-3}$ Vm/N at 25° C. Here, the piezoelectric material is PZT (lead zirconate titanate) or PMN-PT (lead magnesium niobate-lead titanate) or even PVDF (polyvinylidene fluoride). In the latter case, the thickness of the PVDF layers will preferably be less than 300 µm or 100 µm or 10 µm.

An electrode 60 is deposited on the outer face of the membrane 54. The electrode 60 is produced in an electrically conductive material. Here, electrically conductive material denotes a material whose resistivity at 25° C. is less than $10^{-5}$ Ω·m and preferably less than $10^{-6}$ Ω·m or $10^{-7}$ Ω·m. The electrode 60 is directly deposited on the outer face of the membrane 54. Typically, it covers most of this outer face and, preferably, more than 70% or 80% of this outer face (FIG. 5). Here, the electrode 60 is produced using a layer in a single piece of electrically conductive material which covers most of the outer face of the membrane 54. More specifically, in this embodiment, the electrode 60 forms a ring encircling the shaft 8.

In the rest position, the layer 52 extends in a horizontal plane called "reference plane". It is produced, at least partly, in a magnetostrictive material. Here, "magnetostrictive material" denotes a material for which the absolute value of the magnetostriction coefficient $\lambda_s$ at saturation is greater than 10 ppm (parts per million) and, preferably, greater than 100 or 1000 ppm. The coefficient $\lambda_s$ is defined by the following relationship: $\lambda_s = \Delta L/L$, in which:

ΔL is the rate of elongation of the magnetostrictive material along a given direction, and L is the length of this material in this direction in the absence of external magnetic field.

In this embodiment, the coefficient $\lambda_s$ is positive. For example, the magnetostrictive material is Terfenol-D or FeSiB or an alloy of FeCo. The layer 52 is described in more detail with reference to FIG. 5.

In the particular case described here, the layer 52 is also electrically conductive. In these conditions, the layer 52 also fulfills the function of inner electrode for the membrane 54.

Here, the layer 52 is directly deposited and glued onto a substrate 62. The substrate 62 is a non-magnetic substrate, that is to say that does not exhibit any measurable magnetic property in the conditions of use of the generator 2. It forms, with this layer 52, a bimetallic strip which twists by bending, between the bent and less bent positions represented in FIGS. 3 and 4, when the layer 52 is radially elongated. Typically, the amplitude of the maximum travel between its bent and less bent positions is greater than the thickness of the membrane 54. To this end, for example, the bending rigidity of the layer 52 and of the member 54 are adjusted appropriately. The bending rigidity of a layer is adjusted by choosing the material and/or the thickness of the layer for example. Hereinbelow, "bending rigidity" of a layer denotes the product of the Young's modulus of this layer by its thickness. The bending rigidity is also called "flexional rigidity" or "bending strength". In this embodiment, to obtain the desired bending deformation of the converter 20, the materials of the layer 52 and of the membrane 54 and their thicknesses are chosen such that the following relationship is borne out: $E_f * t_f > \alpha * E_s * t_s$, in which:

$E_f$ is the Young's modulus at 25° C. of the layer 52,
$t_f$ is the thickness of the layer 52,
$E_s$ is the Young's modulus at 25° C. of the substrate 62,
$t_s$ is the thickness of the membrane 62,
$\alpha$ is a constant strictly greater than one and, preferably, greater than 10, 20 or 100.

By way of illustration, different possible materials for producing the substrate 62 and the value of their Young's modulus at 25° C. are given below:

| Material | Young's modulus (GPa) |
| --- | --- |
| Silicon | 190 |
| Steel foil | 200 |
| Brass foil | 60 |
| Plexiglass | 3 |

Still by way of illustration, the Young's modulus at 25° C. of Terfenol-D or an alloy of NiTi is typically 150 GPa.

Here, the bending rigidity of the membrane 54 is very much less than the bending rigidity of the bimetallic strip formed by the assembly of the layer 52 and of the substrate 62. "Very much less than" here denotes the fact that $E_M * t_M$ is one hundred or one thousand times less than $E_f * t_f$, in which:

$E_M$ is the Young's modulus at 25° C. of the membrane 54, and
$t_M$ is the thickness of the membrane 54.

By way of illustration, it will be recalled that $E_M$ is approximately 50 GPa for ceramic PZT and approximately 3 GPa for PVDF and the like. Thus, the layer 54 has virtually no limiting effect on the bending deformation of this bimetallic strip.

Figure 6:
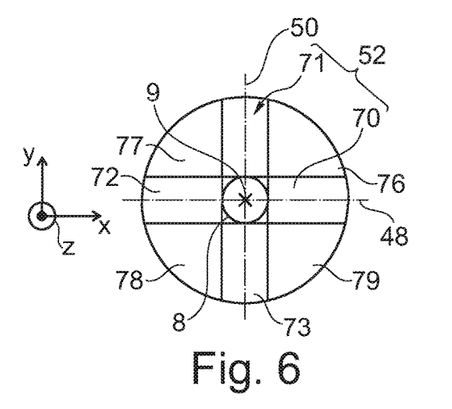
FIG. 6 is a schematic illustration, in plan view, of a transducer layer used in the converter of FIG. 3, FIGS. 7, 8 and 9 are schematic illustrations, in plan view, of other different embodiments of the transducer layer of FIG. 6.

FIG. 6 represents in more detail the structure of the layer 52. The layer 52 is a disk of the same radius as the membrane 54. It comprises four blocks 70 to 73 extending along two horizontal axes intersecting on the axis 9. The angle between these horizontal axes is chosen to be equal to the angle that exists between the directions of the magnetic moments of the set 12 to within plus or minus 10° or 5° and, preferably, to within plus or minus 2°. In FIG. 6, the layer 52 is represented in a first particular position in which the blocks 70 to 73 extend, respectively, along mutually orthogonal axes 48 and 50. More specifically, the blocks 70 and 72 are aligned on the axis 48 whereas the blocks 71 and 73 are aligned on the axis 50.

The blocks 70 to 73 are produced in the same magnetostrictive material. Furthermore, each block 70 to 73 has its own preferential axis of deformation. The preferential axis of deformation of a block is the axis along which the amplitude of its deformation is maximum when it is passed through by field lines parallel to this axis.

For some magnetostrictive material, when the field lines magnetically saturate the magnetostrictive block, the preferential axis of deformation is parallel to these field lines. In this situation, the preferential axis of deformation is imposed by the arrangement of the magnetostrictive block relative to the source of these field lines. When the block of magnetostrictive material is not magnetically saturated, the preferential axis of deformation can also be an intrinsic property of the block which is due, for example, to the crystalline orientation of the magnetostrictive material and/or to the form factor of the block. Here, "form factor" denotes the ratio of the length to the width of the horizontal rectangle of the smallest surface area inside which the block is contained.

Here, typically, the form factor of each block is strictly greater than 1 or 1.5 or 2 and the preferential axis of deformation is parallel to its length. Thus, in the embodiments described below, unless indicated otherwise, the preferential axis of deformation of each block is always the same as its longitudinal axis.

Here, each block 70 to 73 is rectangular. They are all situated in the reference plane.

Furthermore, in this embodiment, the layer 52 also comprises a central part passed through by the shaft 8.

Here, the block 72 and the block 70 are symmetrical relative to the axis 9. Similarly, the block 73 and the block 71 are symmetrical relative to this axis 9. Furthermore, the block 71 and the block 70 are identical apart from the fact that the block 71 is angularly offset by 90° relative to this block 70.

In the first position, each block 70 to 73 is facing a respective magnet 42 to 45. For example, in this first position, for each block 70 to 73, the surface area of the intersection between the orthogonal projections on the reference plane of this block and of a respective permanent magnet of the set 12 is greater than or equal to more than 50% and, preferentially, more than 80% or 90% of the surface area of this block in this plane. In these conditions, it is said that this block is situated within the orthogonal projection of the permanent magnet. Hereinbelow, this same definition is used to define what is understood by the fact that an element is facing a permanent magnet.

In this embodiment, the layer 52 also comprises four regions 76 to 79 without any magnetostrictive material and inserted between the blocks 70 to 73. The lateral edges of these blocks 70 to 73 are therefore mechanically separated from the lateral edges of the other immediately adjacent blocks by these four regions 76 to 79.

The region 76 is delimited on one side by a lateral edge of the block 70 and on the other side by a lateral edge of the block 71. Its outer periphery is aligned with a vertical edge of the layers 54 and 58. The regions 77, 78 and 79 are identical to the regions 76 except that they are angularly offset about the axis 9, respectively by 90°, 180° and 270°. Thus, in this embodiment, each region is essentially in the form of an angular segment whose angle at the vertex is equal to 90°. The thickness of each of these regions 76 to 79 is equal to the thickness of the blocks 70 to 73. In the first position, these regions are situated outside of the orthogonal projections of the permanent magnets of the set 12. An element is considered to be situated outside of the orthogonal projection of a permanent magnet if it is not facing this permanent magnet with the definition given above.

The operation of the generator 2 will now be described. In the first position represented in FIG. 6, the blocks 70 to 73 are passed through by field lines parallel to their respective preferential axis of deformation. In response, the deformation, here the elongation, of the blocks 70 to 73 is maximum. At the same time, the substrate 62 is not elongated. Consequently, the bimetallic strip formed by the superpositioning of the layer 52 and the substrate 62 is bent which brings the anchoring points 55 closer to one another. At the same time, that displaces the membrane 54 from its rest position to its bent position. Consequently, in this first position, electrical charges of the same sign are generated on almost all of the faces of the membrane 54, which increases the electrical energy produced by the converter 20. This excess of electrical charge is collected by the circuit 30 and transmitted to the capacitor 32.

When the converter 20 makes ⅛ of a turn about the axis 9 from the first position, a second position is reached. In this second position, the blocks 70 to 73 are situated mid-way between two consecutive magnets of the set 12. The directions of the magnetic moments of the set 12 are therefore angularly offset by 45° relative to the preferential axes of deformation of the blocks 70 to 73. In this second position, it is the regions 76 to 79 which are facing the magnets 42 to 45. Since these regions 76 to 79 have no magnetostrictive material, the blocks 70 to 73 no longer tend to be elongated but, on the contrary, they shrink simultaneously to return the membrane 54 to its rest position. Thus, in this second position, the mechanical stresses exerted by the blocks 70 to 73 on the membrane 54 are minimum.

Figure 7:
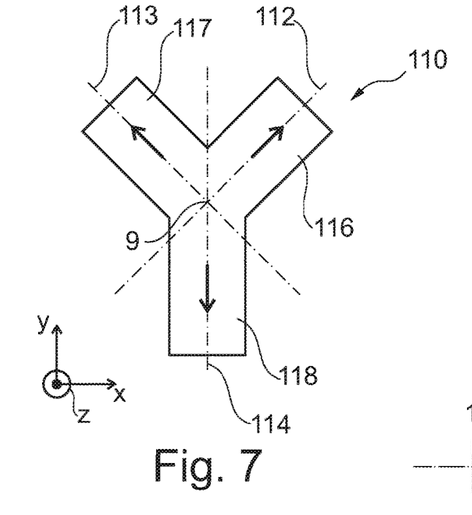

FIG. 7 represents the arrangement of a transducer layer 110 likely to be used instead of the layer 52 in the converter 20. Here, the number of preferential axes of deformation of the transducer layer is equal to three. More specifically, the layer 110 is identical to the layer 52, except that it comprises three blocks 116 to 118 which extend, respectively, along axes 112 to 114. Here, these axes 112 to 114 are angularly offset relative to one another by 120° such that the angular offset between these axes is uniformly distributed about the axis 9. In this embodiment, the magnetostrictive material of the layer 110 is in the form of a "Y".

When the layer 110 is used, the set 12 is replaced by a set of permanent magnets arranged relative to one another for there to be at least one position in which each of these magnets is facing a respective block of the layer 110. Furthermore, these three permanent magnets are arranged to simultaneously exhibit three horizontal magnetic moments whose mutual angular offsets are identical to the angular offsets that exist between the axes 112 to 114. To simplify FIG. 7, only the orthogonal projection of these three magnetic moments on the reference plane is represented by three bold arrows. With such a set of permanent magnets, the operation of a converter incorporating the layer 110 is identical to the operation described for the converter 20. However, the second position in which the membrane 54 is in its rest position is reached after a rotation of 60° about the axis 9 from the first position represented in FIG. 7.

Figure 8:
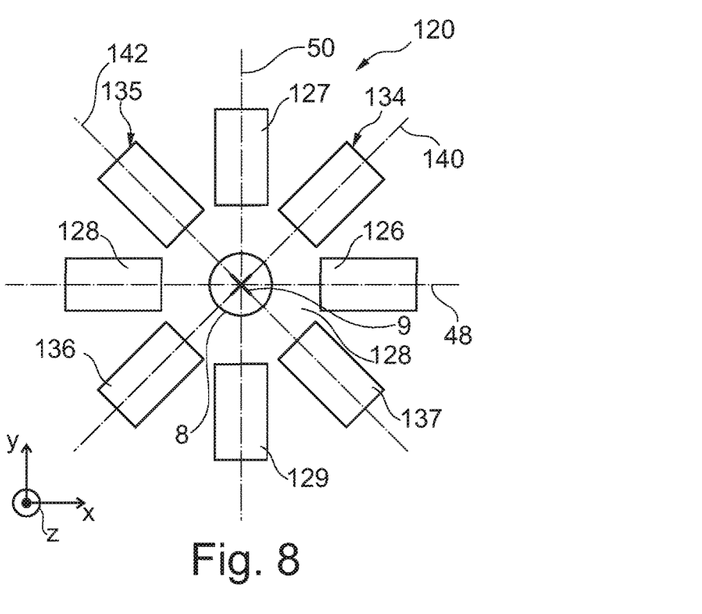

FIG. 8 represents a transducer layer 120 likely to be used instead of the layer 52 in the converter 20. This layer 120 is identical to the layer 52 except that the blocks 70 to 73 are replaced by blocks 126 to 129. These blocks 126 to 129 are for example identical, respectively, to the blocks 70 to 73. In the first position represented in FIG. 8, the blocks 126 to 129 are therefore facing, respectively, the permanent magnets 42 to 45.

In this embodiment, the regions which separate the blocks 126 to 129 each comprise, respectively, a block 134 to 137 of magnetostrictive material different from that used to produce the blocks 126 to 129. More specifically, the blocks 134 to 137 are produced in a magnetostrictive material whose coefficient $\lambda_s$ of magnetostriction is of a sign opposite the magnetostrictive material used to produce the blocks 126 to 129. For example, it is, here, SamFeNol which is an alloy of samarium with negative magnetostriction coefficient.

Here, the arrangement of the blocks 134 and 136 is identical to the arrangement of the blocks 126 and 128, except that they are angularly offset by +45° about the axis 9. Similarly, the arrangement of the blocks 135 and 137 is the same as that of the blocks 126 and 128 except that they are angularly offset by −45° about the axis 9. Thus, the blocks 134 and 136 are aligned on a horizontal axis 140 inclined by +45° relative to the axis 48 and the blocks 135 and 137 are aligned on a horizontal axis 142 inclined by −45° relative to the axis 48. The preferential axes of deformation of the blocks 134 and 136 are aligned on the axis 140 whereas the preferential axes of deformation of the blocks 135 and 137 are aligned on the axis 142.

The layer 120 is designed to operate with the set 12 of permanent magnets. The blocks 126 to 129 operate as described with reference to FIGS. 1 to 6. However, in the second position, the blocks 134 to 137 are located facing the magnets 42 to 45. In this second position, the preferential axes of deformation of the blocks 134 to 137 are aligned with the magnetic moments of the set 12. Consequently, the blocks 134 to 137 shrink, which displaces the membrane 54 into another bent position in the reverse direction of that represented in FIG. 4. Thus, in this second position, almost all of the inner surface of the membrane 54 is subjected to a tension stress. This therefore makes it possible to increase the amplitude between the potential differences produced in the first and second positions relative to the embodiment of FIG. 1 and therefore to increase the efficiency of the converter.

Figures 9, 10:
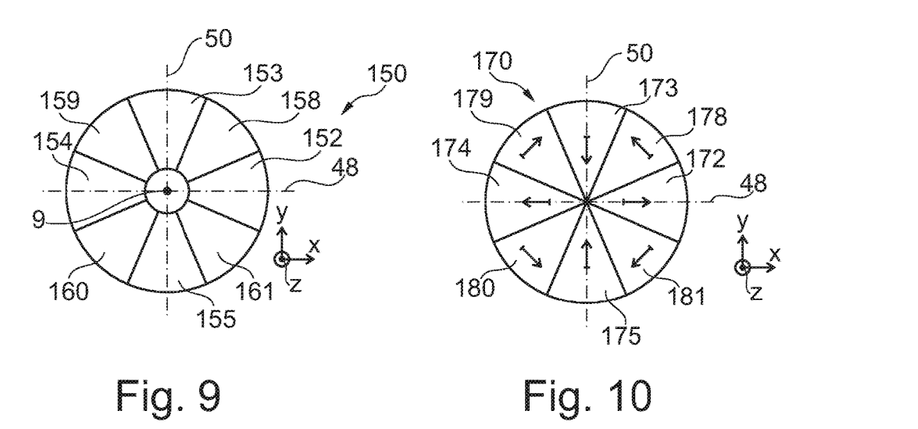

FIG. 9 represents, in a first position, a transducer layer 150 likely to be used instead of the layer 52 in the converter 20. This layer 150 is identical to the layer 52 except that the blocks 70 to 73 are replaced by blocks 152 to 155. In the first position, the blocks 152, 154 extend along the axis 48 and the blocks 153, 155 extend along the axis 50. The longitudinal axes of the blocks 152 to 155 are aligned on the axes along which they extend. The block 152 is essentially in the form of an angular segment whose vertex is situated on the axis 9 and the bisecting line of which is merged with the axis 48 in the first position. The angle at the vertex of the block 152 is equal to 45°. Here, the vertex of this angular segment is eliminated to leave a passage for the shaft 8. The blocks 153 to 155 are identical to the block 152 except that they are angularly offset about the axis 9 relative to the block 52 by, respectively, 90°, 180° and 270°. With this choice of the value of the angle at the vertex of the block 152, the regions 158 to 161 without any magnetostrictive material are also angular segments of the same form as the block 152 but angularly offset about the axis 9, respectively, by 45°, 135°, 225° and 315° relative to the position of the angular segment of the block 152.

FIG. 10 represents a set 170 of permanent magnets intended to replace the set 12 when the layer 52 is replaced by the layer 150. The set 170 is identical to the set 12 except that the permanent magnets 42 to 45 are replaced, respectively, by permanent magnets 172 to 175. The magnets 172 to 175 each have the same form as the blocks 152 to 155 and are arranged relative to one another as described for the blocks 152 to 155. However, the vertex of the angular segment of each magnet has not been eliminated to leave a passage for the shaft 8. Thus, in the first position, each block 152 to 155 is facing a respective magnet 172 to 175. The directions of the magnetic moments of the magnets 172 and 174 are aligned on the axis 48. Conversely, the directions of the magnetic moments of the magnets 173 and 175 are aligned on the axis 50.

Facing the regions 158 to 161, in the first position, the set 170 comprises additional permanent magnets, respectively 178 to 181. Each of these magnets 178 to 181 has the same form as the magnet 172. These magnets 178 to 181 are angularly offset about the axis 9 by, respectively, 45°, 135°, 225° and 315° relative to the position of the magnet 172. Thus, after a rotation of 45° of the layer 150 to reach a second position, each block 152 to 155 is located facing a respective magnet 178 to 181.

The direction of the magnetic moments of the magnets 178 to 181 is chosen so that the magnetic field lines that they generate within the blocks 152 to 155 in the second position are turned by 90°, in a horizontal plane, relative to the magnetic field lines that the magnets 172 to 175 generate within these same blocks but in the first position. For that, the direction of the magnetic moment of each magnet 178 to 181 is at right angles to the bisecting line of the angular segment occupied by this magnet and whose angle at the vertex is situated on the axis 9.

In the operation of the layer 150, in the first position, the blocks 152 to 155 are elongated radially and the membrane 154 reaches its bent position represented in FIG. 4. In the second position, the blocks 152 to 155 are this time facing the magnets 178 to 181. In this second position, the magnetic field lines which pass through the blocks 152 to 155 are at right angles to the longitudinal axes of these blocks. Consequently, in the second position, each block 152 to 155 is elongated in the direction of the field lines which pass through it which correspond to a shrinkage in the horizontal direction at right angles to its longitudinal axis. The bimetallic strip formed by the layer 150 and the substrate 62 is then bent in the reverse direction and the membrane 54 is displaced to a less bent position in which it is incurved in the reverse direction. This therefore makes it possible to increase the amplitude between the potential differences produced in the first and second positions.

The embodiments described hitherto have been described in the particular case where the converter rotates relative to the set of permanent magnets. However, everything that has been described in this particular context applies equally to the case where the set of permanent magnets is displaced in translation relative to the converter parallel to the reference plane. To switch from one embodiment to the other, it is sufficient to "unwind" the structures described in the case of a rotary movement to obtain the corresponding embodiment in the case of a translational movement.

Figure 11:
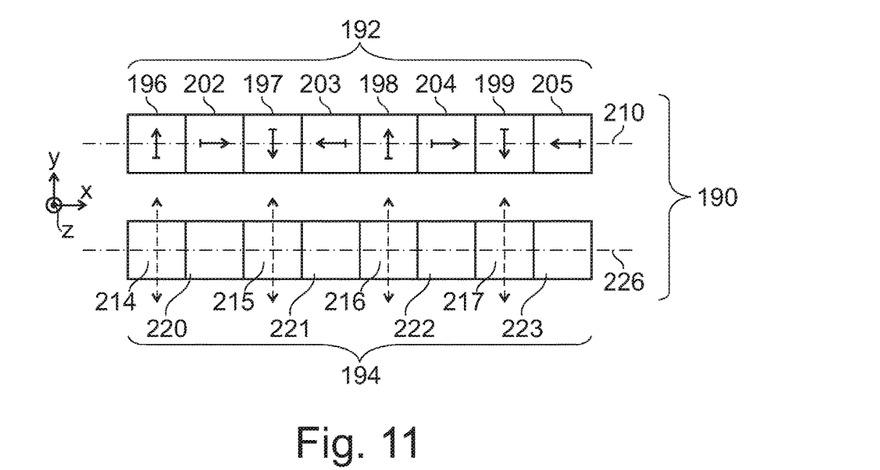
FIG. 11 is a schematic illustration, in plan view, of another embodiment of the generator of FIG. 1 in the case of a translational movement.

For example, FIG. 11 represents a generator 190 corresponding to the embodiment of FIGS. 9 and 10 but with a translational movement. To simplify FIG. 11, only the main elements which differ from the generator 2 are represented. More specifically, in the generator 190, the set 12 is replaced by a set 192 of permanent magnets and the layer 52 is replaced by a layer 194. The layer 194 is inserted between a piezoelectric membrane and a non-magnetic substrate that are similar, respectively, to the membrane 54 and to the substrate 62. In FIG. 11, the set 192 and the layer 194 are represented in plan view and alongside one another. In reality, the set 192 and the layer 194 are superposed vertically one on top of the other.

The set 192 comprises four permanent magnets 196 to 199 and four permanent magnets 202 to 205. All these magnets are aligned on a same axis 210 parallel to the direction X. The magnets 202 to 204 are inserted between, respectively, the magnets 196, 197, the magnets 197, 198 and the magnets 198, 199. The magnet 205 is attached, on the right, to the magnet 199. The magnets 196 to 199 each have a uni-axial magnetic moment parallel to the direction Y. The magnets 202 to 205 each have a uni-axial magnetic moment parallel to the direction X. All the magnets have the same width in the direction X.

The layer 194 comprises four blocks 214 to 217 in the same magnetostrictive material separated by four regions 220 to 223 without any magnetostrictive material. These blocks and regions are all aligned on an axis 226 parallel to the direction X. More specifically, the regions 220 to 222 are inserted between, respectively, the blocks 214, 215, the blocks 215, 216 and the blocks 216, 217. The region 223 is here attached to the right of the block 223. This region 223 can also be omitted. The preferential axes of deformation of the blocks 214 to 217 are parallel to the direction Y.

The set 192 and the layer 194 can be displaced relative to one another between a first position, represented in FIG. 11, and a second position. In the second position, the layer 194 is offset by one pitch to the left, in the direction X, relative to the first position. Here, the pitch is equal to the width of a permanent magnet of the set 192.

In the first position, the blocks 214 to 217 are situated facing the magnets 196 to 199 and the regions 220 to 223 are situated facing the magnets 202 to 205. In the second position, it is the regions 220 to 223 which are situated facing the magnets 196 to 199 and the blocks 215 to 217 which are situated facing the magnets 202 to 204. In this example, in the second position, the block 214 is not facing any element.

In the arrangement described, the magnets 196 to 199 correspond functionally to the magnets 172 to 175 and the magnets 202 to 205 correspond functionally to the magnets 178 to 181. Similarly, the blocks 214 to 217 correspond functionally to the blocks 152 to 155 and the regions 220 to 223 correspond functionally to the regions 158 to 155. Thus, the operation of the generator 190 is deduced from the operation of the layer 150 with the set 170 except that here, the electricity generation is provoked by a translational displacement in the direction X of the layer 194 relative to the set 192 and not by a rotational movement.

Figure 12:
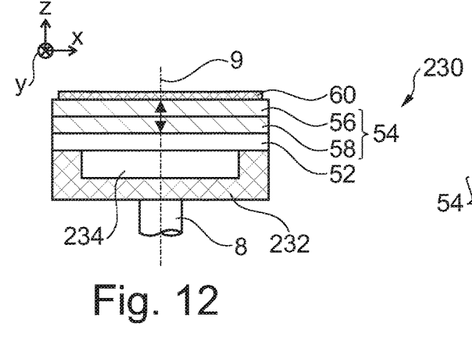
FIGS. 12 to 17 are schematic illustrations, in vertical cross section, of other different possible embodiments of the converter of FIG. 3.

FIG. 12 represents a converter 230. This converter 230 is identical to the converter 20 except that the substrate 62 is replaced by a substrate 232. The substrate 232 is identical to the substrate 62 except that it comprises a cavity 234 formed between the inner face of the layer 52 and the top face of the substrate 232. This cavity is centered about the vertical axis 9. Furthermore, in FIG. 12, the converter 230 is mounted at the end of the shaft 8. Consequently, in this embodiment and in the following embodiments, the shaft 8 does not pass through the converter. The operation of the converter 230 is deduced from the explanations given for the converter 20.

Figure 13:
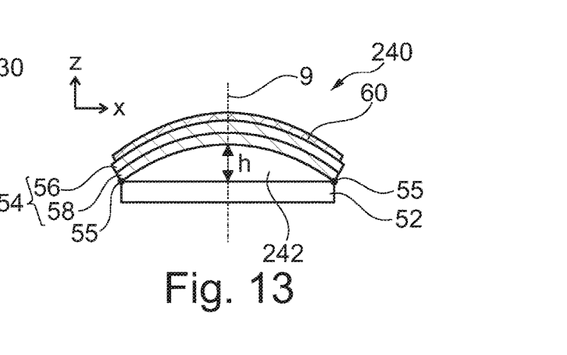

FIG. 13 represents a converter 240 identical to the converter 20 except that:

the substrate 62 is omitted, the anchoring points 55 between the membrane 54 and the layer 52 are only situated on the outer periphery of the membrane 54 and of the layer 52, and the membrane 54 is prestressed for it to be in its bent position in the absence of a magnetic field.

Here, the outer periphery of the layer 52 and of the membrane 54 is a horizontal circle whose center is situated on the axis 9. This periphery combines all the ends of the membrane 54 furthest away from the axis 9. Each end of the membrane 54 situated on its outer periphery has a corresponding other end also situated on its outer periphery, but on the side diametrically opposite relative to the axis 9.

In this embodiment, in the bent position, a central part of the layer 52 situated between the anchoring points 55 is separated from the membrane 54 by a hollow space 242. Typically, the maximum height of this space 242 in the vertical direction is greater, and preferably ten or a hundred or a thousand times greater, than the thickness of the membrane 54. This maximum height corresponds to the bend of the membrane 54.

Figure 14:
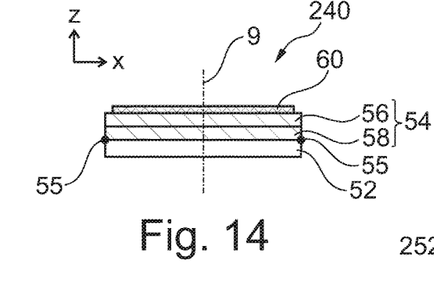

FIG. 14 represents the converter 240 when the membrane 54 is in its less bent position. This less bent position is reached when the converter 20 is in its first position relative to the set 12 of magnets. In this first position, the elongation of the layer 52 is maximum. That therefore distances the points 55 from one another and displaces the membrane 54 toward its less bent position. In this example, in a less bent position, the space 242 has disappeared and the membrane 54 extends horizontally along the central part of the layer 52. The layer 52 is not bent or only negligibly bent because the bending rigidity of the membrane 54 is at least two or ten times or one hundred times less than the bending rigidity of this layer 52.

FIGS. 15 and 16 represent a converter 250 likely to be used in place of the converter 230. This converter 250 comprises a frame 252 in which is anchored, with no degree of freedom, the outer periphery of the membrane 54.

In the converter 250, the layer 52 is separated from the inner face of the membrane 54 by a cavity 254. The layer 52 is also fixed onto the frame 252 via a slide link which immobilizes the layer 52 in the direction Z, but which allows it to elongate and to shrink in the horizontal directions X and Y. For example, the periphery of the layer 52 bears slidingly on horizontal and planar faces of the frame 252.

In this embodiment, the layer 52 is mechanically connected to the membrane 54 via tensioned arms housed in the cavity 254. More specifically, these arms are mechanically connected, on one side, to a mid-point 256 and, on the other side, to respective anchoring points situated on the layer 52. The mid-point 256 is situated at the intersection between the inner face of the membrane 54 and the axis 9. Here, the mid-point 256 serves as fixing point for the arms on the membrane 54. The anchoring points are situated on the layer 52 only in proximity to the distal ends of the blocks 70 to 73 furthest away from the axis 9.

The substrate 62 is omitted.

In FIG. 15, only two arms 258 and 259 are visible. The arms 258 extend between the mid-point 256 and an anchoring point 262, whereas the arm 259 extends between the mid-point 256 and a respective anchoring point 263. The anchoring points 262 and 263 are diametrically opposite relative to the axis 9.

FIG. 15 represents the converter 250 in the situation where the layer 52 is in the second position relative to the set 12 of magnets. In this position, the blocks 70 to 73 and the anchoring points 262, 263 are in the close position, and the membrane 54 extends substantially horizontally.

FIG. 16 represents the converter 250 when the layer 52 is in its first position relative to the set 12 of permanent magnets. In this position, the anchoring points 262, 263 are in their position furthest away from one another. The arms 258 and 259 are here sufficiently rigid under tension to not be elongated when the layer 52 is elongated. In these conditions, because the anchoring points 262 and 263 move away from the mid-point 256, the arms 258 and 259 pull this mid-point 256 vertically downward, and the membrane 54 bends from its less bent position to its bent position. It should be noted that, in this embodiment, the arms 258 and 259 work by tension and not by compression. Consequently, they do not need to be rigid under compression.

The layer 52 is deformed almost only in a horizontal plane, whereas the membrane 54 is deformed by bending because the bending rigidity of the membrane 54 is very much less than that of the layer 52.

FIG. 17 represents a converter 270. This converter 270 comprises a frame 272 to which is fixed, with no degree of freedom, only the center of the outer face of the membrane 54. The center of this outer face is situated on the axis 9.

Fixing points are produced on the outer periphery of the inner face of the membrane 54. The fixing points are situated on diametrically opposite ends of the membrane 54. Each fixing point is also placed facing a respective anchoring point situated on the distal end of a respective block of the layer 52. In FIG. 17, only diametrically opposite fixing points 274 and 275 can be seen on the inner face. These fixing points 274 and 275 are facing, respectively, anchoring points 276 and 277 situated on the layer 52. Each anchoring point of the layer 52 is mechanically attached to a fixing point situated on the inner face of the membrane 54 by tensioned rigid arms, that is to say arms which do not elongate when the layer 52 is elongated.

Here, the anchoring points 276 and 277 are diametrically opposite relative to the axis 9.

In FIG. 17, only two arms 280 and 281 have been represented. The arm 280 mechanically connects the point 276 to the point 275, whereas the arm 281 mechanically connects the point 277 to the point 274.

When the layer 52 is elongated, the points 277 to 276 move away from one another. Consequently, the arms 280 and 281 simultaneously pull the points 274 and 275 situated on the membrane 54 downward. Thus, in response, the membrane 54 bends so that its outer periphery is closer to the layer 52 than in the position represented in FIG. 17. In effect, the center of the layer 54 is kept immobile by the frame 272 and the bending rigidity of the layer 52 is very much greater than that of the membrane 54.

In this embodiment, when the anchoring points are in their close position, the membrane 54 is in its less bent position. Conversely, when the anchoring points are in their distant position, the membrane 54 is in its bent position.

Figure 18:
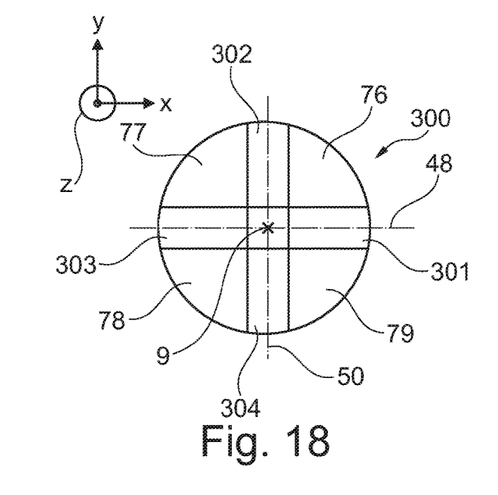
FIG. 18 is a schematic illustration, in plan view, of another embodiment of a transducer layer that can be used in the converter of FIG. 3 to harvest a temperature variation.

FIG. 18 represents a transducer layer 300 intended to replace the layer 52 when the variation of energy to be harvested is a variation of temperature. The layer 300 is here identical to the layer 52 except that the blocks 70 to 73 are replaced, respectively, by blocks 301 to 304. In this embodiment, the blocks 301 to 304 are identical to the blocks 70 to 73 except that they are produced in a material with shape memory. The preferential axis of deformation of the blocks 301 and 303 is parallel, in the first position represented in FIG. 18, to the axis 48. In this first position, the preferential axis of deformation of the blocks 302 and 304 is parallel to the axis 50. As in the case of the blocks of magnetostrictive material, the preferential axis of deformation is, here, the axis along which the amplitude of the deformation is maximum in response to a given variation of temperature. Furthermore, as for the blocks in magnetostrictive material, when the block of material with shape memory contracts along its preferential axis of deformation, it simultaneously elongates along a horizontal axis at right angles. Each block 301 to 304 is here configured for, in response to an increase in the external temperature, it to contract along its preferential axis of deformation and, simultaneously, elongate along another axis at right angles. However, in the case of the materials with shape memory, the direction of the preferential axis of deformation is an intrinsic characteristic of the block configured in its production. Thus, the direction of the preferential axis of deformation of the blocks 301 to 304 does not depend on their relative position in relation to the source of energy to be harvested. Here, the material with shape memory has an elongation rate, along its preferential axis of deformation, greater than 0.5% or 1% in response to a variation of temperature of 10° or of 20° C. For more information on the materials with shape memory that can be used in such a converter, reference can be made to the article A1.

Figure 19:
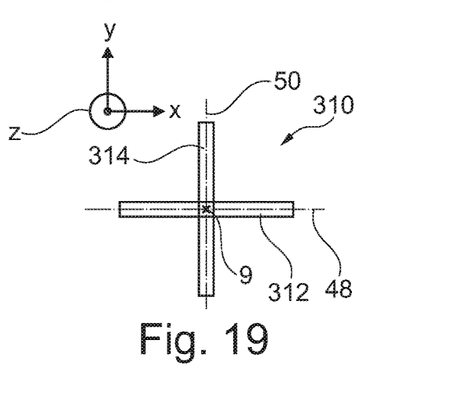
FIG. 19 is a schematic illustration, in plan view, of an embodiment of a source of energy to be harvested producing heat.

In the case where the layer 300 is used in the converter, the set 12 of permanent magnets is replaced by a set 310 of local sources of heat represented in FIG. 19. The set 310 comprises two local sources 312 and 314 of heat. The sources 312 and 314 extend only along, respectively, axes 48 and 50 so as to essentially heat the blocks facing these axes while heating much less the regions which are not facing these axes. For example, in this first position, for each block 301 to 304, the surface area of the intersection between the orthogonal projections on the reference plane of this block and of the source facing the set 310 is greater than or equal to more than 30% or 50% and, preferably, more than 80% or 90% of the surface area of this block in this plane. As an illustration, the sources 312 and 314 are pipes that are passed through by a heat transfer fluid. The sources 312 and 314 can also be filaments or heating resistors. In this embodiment, since the layer 300 rotates relative to the set 310, the temperature of the sources 312 and 314 is, for example, constant. The blocks 301 to 304 are heated when they are located facing the sources 312 and 314 and cool down when they are facing the regions 76 to 79. The operation of the generator equipped with the layer 300 and the set 310 is deduced from the explanations given with reference to FIGS. 1 to 6.

Many other embodiments are possible. For example, an additional prestressed layer can be glued onto one of the faces of the piezoelectric membrane for this membrane to be incurved even in the absence of variations of the energy to be harvested. In its rest position, the membrane is bent, while, in response to a variation of the energy to be harvested, bending of the membrane can increase or, on the contrary, decrease. That therefore notably makes it possible to generate, between the terminals 22 and 24, sometimes a positive potential difference and sometimes a negative potential difference.

Whatever the embodiment described previously, the ends of the piezoelectric membrane can be fixed, not directly to the anchoring point, but via mechanical arms such as the arms 280 and 281 described previously.

The membrane 54 is not necessarily formed by two piezoelectric layers. As a variant, one of the layers 56, 58 is omitted. Conversely, additional layers of piezoelectric material can be added.

Nor is the piezoelectric layer of the membrane 54 necessarily of a single block. For example, it can also be produced by attaching a number of blocks of piezoelectric material alongside one another. However, even in this case, the different blocks of the piezoelectric layer are fixed to one another with no degree of freedom so as to behave mechanically like a single block of material. Typically, in this case, all the blocks of piezoelectric material are polarized with the same sign.

Other piezoelectric materials can be used. For example, the piezoelectric material can be a piezoelectric foam such as one of those described in the following article: Imran Patel, "*Ceramic based intelligent piezoelectric energy harvesting device*", Intechopen, 6 Sep. 2011.

The membrane 54 of piezoelectric material can have other forms. For example, advantageously, it can also be shaped in the form of an ellipse rather than a disk. The horizontal section of this membrane 54 can also, as a variant, be square or rectangular or be a polygon with more than five vertices.

The number of blocks of the transducer layer and the number of sources of energy to be harvested can be greater than four, eight or twelve. This number can be very great notably in the case of a linear displacement as described with reference to FIG. 11. Preferably, if the displacement between the first and second positions is made by rotation, then the number of blocks is less than twelve. Furthermore, when the displacement between the first and second positions is made by rotation, preferably, the blocks and the sources are uniformly distributed about the axis of rotation.

The number of blocks can also be equal to one. In this case, the block and the membrane are, for example, rectangular.

The different blocks of the transducer layer do not necessarily extend in the same plane. In this case, the reference plane is the median plane to the various planes in which these different blocks extend and the orthogonal projection of a block is considered on this reference plane to know whether the latter is situated within the orthogonal projection of a source.

A magnetostrictive material with negative magnetostriction coefficient can be used in place of a magnetostrictive material with positive magnetostriction coefficient. For example, it can be SamFeNol which is an alloy of samarium with negative magnetostriction coefficient. In this case, the membrane 54 is bent in the reverse direction relative to that which was described in the case of a magnetostrictive material with positive magnetostriction coefficient.

The magnetostrictive material can also be replaced by an alloy with magnetic shape memory, such as NiMnGa that is to say a material which works as described for the preceding materials with shape memory except that the deformation is triggered by a variation of the magnetic field and not by a variation of temperature.

As a variant, the anchoring points are not necessarily situated on the ends of the blocks of the transducer layer. For example, these blocks can extend beyond the anchoring points even though, in practice, it is not necessary to displace the anchoring points.

The form of the membrane and of the transducer layer is not necessarily circular. For example, this membrane and this layer can be rectangular. In this case, the anchoring points are preferably situated on the small sides of the transducer layer.

If the bending rigidity of the membrane 54 is less than the bending rigidity of the layer 52, then the substrate 62 can be omitted.

The substrate 62 can also be placed elsewhere instead of being directly glued under the layer 62. For example, the substrate 62 can be inserted between the two layers 56, 58 or between the membrane 54 and the layer 52. The membrane 52 can also be placed between the two layers 56, 58. In this case, when the layer 56 undergoes a tensional stress, the layer 58 undergoes a compression stress and vice versa.

The electrode 60 does not need to be formed of a single block of material. As a variant, the electrode 60 comprises a number of conductive blocks distributed over the outer face of the membrane 54 and mechanically separated from one another by trenches filled with an electrically insulating material, electrical conductors connecting these different blocks in series.

As a variant, an inner electrode of electrically conductive material is inserted between the layer 52 and the membrane 54. That proves necessary in any embodiment where the transducer layer is produced in a material which is not electrically conductive or in the embodiments where the layer 52 is electrically insulated from the inner face of the membrane 54.

The outer electrodes are not necessarily fixed directly onto the piezoelectric membrane. For example, they can be separated from this membrane by a thin intermediary insulating layer whose thickness is less than a hundredth or a thousandth of the thickness of the membrane. They can also be slightly mobile relative to the layer of piezoelectric material.

Each permanent magnet can be produced in a single block of material. Each permanent magnet can also be composed of a stack of a number of magnetized plates one on top of the other, each plate of the stack having a magnetic moment parallel to that of the other plates of this stack. The sign of the magnetic moment of one plate relative to that of the other plates of the same stack is unimportant because the magnetostrictive material is only sensitive to the direction of the magnetic moment and not to its sign.

The set 12 can be produced without using permanent magnets. For example, it can be produced by using coils passed through by a current.

The permanent magnets of the set 12 can be arranged in a plane which is not necessarily horizontal. In another variant, the directions of the magnetic moments of the sources of the set are not all coplanar.

The magnet 46 can be omitted.

The various embodiments described previously can be combined. For example, the set 170 can be used with the layer 120.

All the embodiments described previously in the particular case of blocks of magnetostrictive material can be adapted to the harvesting of a variation of temperature by replacing these magnetostrictive blocks with blocks produced using material with shape memory. Furthermore, in the case of the blocks of material with shape memory, it is possible to vary the temperature of these blocks without displacing the layer 300 relative to local sources of heat. For that, for example, the set 310 is replaced by a source of heat capable of heating, in the same way and simultaneously, all the blocks 301 to 304, and whose temperature varies over time.

A number of converters 20 centered on the axis 9 can be stacked vertically one on top of the other.

The converter can also be mounted at the end of the shaft 8 so that the piezoelectric membrane and the transducer layer are not passed through by this shaft 8.

The relative movement of the set 12 relative to the converter 20 can also be obtained by fixing the set 12 with no degree of freedom onto the end of the axis 8 and by fixing the converter 20 onto the immobile frame 14.

The apparatus 10 can be a mechanical rolling bearing. In this case, the axis 8 is the axis of this rolling bearing and the frame 14 is the frame of the rolling bearing.

The invention claimed is:

1. A converter of a variation of energy to be harvested into a potential difference between two connection terminals, the variation of energy to be harvested being a variation of magnetic field or of temperature, this converter including:
   a piezoelectric membrane including:
      parallel inner and outer faces,
      at least two ends diametrically opposed relative to a plane at right angles to its inner and outer faces, and passing through the center of gravity of the piezoelectric membrane, and
      a mid-point situated mid-way between the diametrically opposed ends;
   first and second electrodes of electrically conductive material extending substantially along at least one face of the piezoelectric membrane to reveal an excess of electrical charges on one of these electrodes in response to deformation of the piezoelectric membrane;
   a transducer layer extending between anchoring points, this transducer layer being configured to transform the variation of energy to be harvested into a mechanical displacement of the anchoring points relative to one another between a distant position, in which the anchoring points are distant from one another, and a close position in which the anchoring points are closer to one another, each of these anchoring points being attached to a fixing point situated on the piezoelectric membrane to deform this piezoelectric membrane by bending reversibly between a bent position and a less bent position when these anchoring points are displaced, amplitude of the maximum travel between its bent and less bent positions being greater than the thickness of the piezoelectric membrane; and
   a frame;
   wherein only one of the ends of the membrane and of the mid-point is fixed, without any degree of freedom, in the frame;
   wherein the converter comprises, between each anchoring point and the fixing point to which it is attached, a rigid arm tensioned between this anchoring point and this fixing point, this arm being configured to transform displacement of the anchoring points into a displacement which deforms the piezoelectric membrane between its bent and less bent positions; and
   the fixing point being situated on the mid-point when the ends of the piezoelectric membrane are fixed, with no degree of freedom, in the frame and the fixing point being situated on a respective end of the piezoelectric membrane when the mid-point is fixed, with no degree of freedom, in the frame.

2. The converter as claimed in claim 1, wherein the bending rigidity of the piezoelectric membrane is approximately one hundred times less than the bending rigidity of the transducer layer, the bending rigidities of the piezoelectric membrane and the transducer layer being equal to a product of a Young's modulus and a thickness of the piezoelectric membrane and the transducer layer, respectively.

3. The converter as claimed in claim 1, wherein the transducer layer comprises a number of blocks of material with shape memory separated from one another by regions without any such block, each block having a preferential axis of deformation along which the amplitude of its deformation is maximum when it is heated, these blocks being arranged relative to one another such that the preferential axes of deformation of the different blocks intersect at a same central point and are uniformly distributed around this central point, the anchoring points being placed on the ends of each of these blocks situated on the side opposite the central point.

4. The converter as claimed in claim 3, wherein the number of blocks uniformly distributed around the central point is greater than three.

5. The converter as claimed in claim 1, wherein the converter comprises a rigid arm, tensioned between each anchoring point and the mid-point of the piezoelectric membrane, this arm being configured to transform the displacement of the anchoring points into a displacement of the mid-point along a direction at right angles to the faces of the piezoelectric membrane and thus deform the piezoelectric membrane between its bent and less bent positions.

6. The converter as claimed in claim 1, wherein, when the mid-point is fixed with no degree of freedom in the frame, the fixing point of the arm is situated on the diametrically opposite end of the piezoelectric membrane, on the end opposite the end of the piezoelectric membrane closest to the anchoring point from which this arm extends.

7. The converter as claimed in claim 6, wherein each fixing point is placed facing a respective anchoring point and each anchoring point of the transducer layer is mechanically attached to a fixing point situated on an inner face of the piezoelectric membrane by tensioned rigid arms which are not elongated when the transducer layer is elongated.

8. An electricity generator comprising:
the converter according to claim 1; and
a set of a number of first sources of energy to be harvested fixed to one another with no degree of freedom, each first source locally generating energy to be harvested;
wherein the transducer layer comprises a number of first blocks of magnetostrictive material or material with shape memory and, inserted between lateral edges of these first blocks, regions without any first block; and
at least one of the set and of the converter can be displaced alternately, within the reference plane, between:
a first position in which the first blocks are arranged facing a first respective source of energy to be harvested, and
a second position in which the regions are arranged facing a first respective source and each first block is situated mid-way between two first sources.

9. The generator as claimed in claim 8, wherein:
the first blocks are produced in magnetostrictive material and have magnetostriction coefficients of a same sign,
the first sources are sources of magnetic field fixed to one another with no degree of freedom, each first source being configured, in the first position, to generate, within the first block facing, field lines parallel to the reference plane and to a preferential axis of deformation of this first block.

10. The generator as claimed in claim 9, wherein the set further comprises second sources of magnetic field, inserted between the first sources, these second sources being facing a first respective block in the second position, each second source being configured, in the second position, to generate, within the first block facing, field lines parallel to the reference plane and at right angles, to within plus or minus 10°, to the preferential axis of deformation of this first block.

11. The generator as claimed in claim 9, wherein the transducer layer comprises second blocks of magnetostrictive material inserted between the lateral edges of the first blocks, each second block being situated, in the second position, facing a first respective source of magnetic field, the magnetostriction coefficients of the second blocks being of a sign opposite the magnetostriction coefficients of the first blocks.

12. The generator as claimed in claim 9, wherein each source of magnetic field comprises at least one permanent magnet.

13. The generator as claimed in claim 8, wherein:
the first blocks are produced in material with shape memory, each block having a preferential axis of deformation along which the amplitude of its deformation is maximum in response to a variation of temperature,
the first sources are sources of heat fixed to one another with no degree of freedom, each first source being configured, in the first position, to heat the first block facing more than the regions situated on either side of this first block.

14. The generator as claimed in claim 8, wherein the set of sources can be displaced in rotation, relative to the converter, about an axis of rotation at right angles to the reference plane to pass between the first and second positions, and the first sources are uniformly distributed about the axis of rotation.

15. The generator as claimed in claim 10, wherein the set of sources can be displaced in translation, relative to the converter, along an axis of translation parallel to the reference plane to pass between the first and second positions, and the first sources are uniformly distributed along this axis of translation.

* * * * *